May 2, 1961 O. C. MONTGOMERY 2,982,919

AUTOMATIC GAIN CONTROL AMPLIFIER AND SEISMIC AMPLIFIER SYSTEM

Filed March 3, 1955 3 Sheets-Sheet 1

INVENTOR.
O. C. MONTGOMERY
BY Hudson & Young
ATTORNEYS

INVENTOR.
O. C. MONTGOMERY
BY Hudson & Young
ATTORNEYS

INVENTOR.
O. C. MONTGOMERY
BY Hudson & Young
ATTORNEYS

United States Patent Office 2,982,919

Patented May 2, 1961

2,982,919

AUTOMATIC GAIN CONTROL AMPLIFIER AND SEISMIC AMPLIFIER SYSTEM

Orin C. Montgomery, Bartlesville, Okla., assignor to Phillips Petroleum Company, a corporation of Delaware Filed Mar. 3, 1955, Ser. No. 491,852

3 Claims. (Cl. 330—137)

This invention relates to an amplifier incorporating a novel automatic gain control circuit. In another aspect, it relates to a system for amplifying seismic signals from a plurality of seismometers and feeding the amplified signals to a recorder. In still another aspect, it relates to a wave generating circuit for such system. In still another aspect, it relates to a testing circuit for such system.

In seismic prospecting work, a recording is made of the output signals of a number of seismometers which are sensitive to earth tremors, usually artifically produced by the detonation of an explosive charge. In such systems, the initial output signals have a high amplitude, while the succeeding signals have considerably less amplitude. Accordingly, automatic gain control circuits have been incorporated in seismic amplifiers, along with various types of filter circuits, to maintain a fairly constant level of amplitude of the signal fed to the recorder from the amplifier system.

In accordance with this invention, an improved amplifier of this type is provided wherein an oscillating voltage is applied to the automatic gain control channel just before, and during the initial period when the signals have excessively high amplitude. This signal reduces the amplifier gain, and blocks the automatic gain control system so as to prevent the first high amplitude signals from passing through the amplifier at a high level of amplifier gain. In one embodiment of the invention, the oscillating voltage is removed shortly after the start of the recording period, and the system thereafter functions as a normal automatic gain control circuit. In another embodiment, the amplitude of the oscillating voltage applied to the automatic gain control system is progressively reduced in a predetermined manner as the recording period proceeds. In still another embodiment, the oscillating voltage is applied continuously to the automatic gain control circuit throughout the recording period. Also, provision is made for operating the unit as an amplifier with the normal automatic gain control action. It will be apparent from the foregoing, that the amplifier system of this invention is very flexible, and is readily adjustable to meet a wide variety of conditions encountered in seismic prospecting work. This flexibility is further enhanced by novel filter circuits and switching means which can be actuated to further improve the characteristics of the amplified signal.

In another phase of the invention, the described amplifier system provides a test voltage which can be either of sinusoidal or rectangular wave form, and there is a novel indicating circuit which enables the power supply voltages to be readily checked, as well as the continuity and leakage resistance to ground of the seismometer circuits.

Accordingly, it is an object of the invention to provide an automatic gain control amplifier of novel construction.

It is a further object to provide a seismic amplifier system embodying such improved gain control action.

It is a further object to incorporate in such system a wave generator of novel character.

It is a still further object to provide a flexible indicating circuit for such seismic amplifier system.

It is a still further object to provide a seismic amplifier system of improved character which is very flexible and reliable in operation, and provides results of great accuracy in seismic prospecting work.

Various other objetcs, advantages and features of the invention will become apparent from the following detailed description taken in conjunction with the accompanying drawings, in which.

Figure 1:
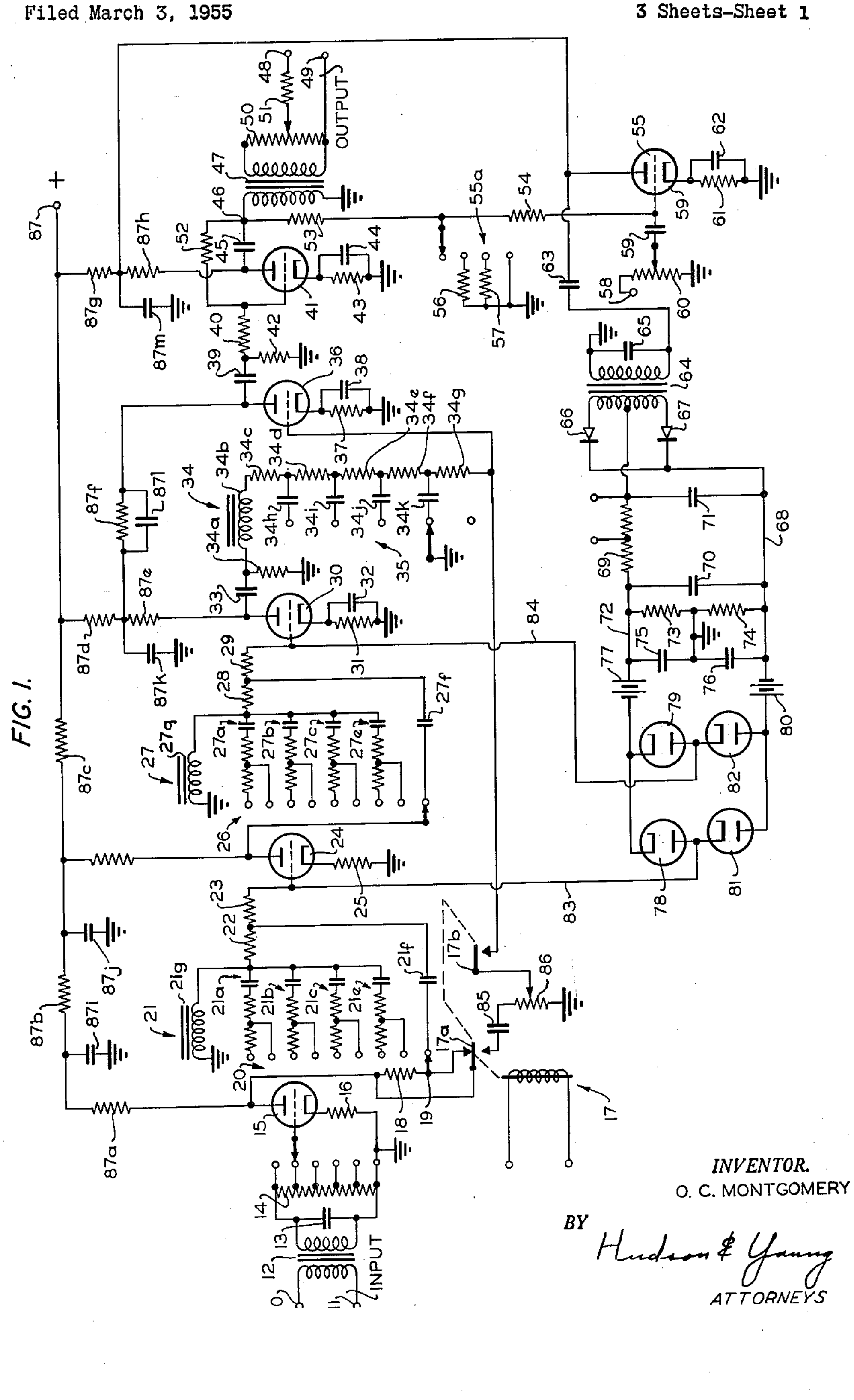
Figure 1 is a schematic circuit diagram of the amplifier circuit and a portion of the automatic gain control circuit.

Referring now to Figure 1, it will be understood that there are a plurality of amplifiers, one for each seismometer, and each amplifier has the circuit indicated by Figure 1. The input signal from the seismometer appears across a pair of input terminals 10, 11 which are connected to the primary winding of an input transformer 12. Connected in parallel with the secondary winding of transformer 12 are a condenser 13 and a potentiometer 14, one terminal of which is grounded and the other fixed terminal of which is connected to the ungrounded terminal of the secondary winding. The contactor of potentiometer 14 is connected to the control grid of an amplifier tube 15, the cathode of which is grounded through a bias resistor 16.

The anode of tube 15 is connected to a common terminal of a set **17*a* of contacts of a relay 17 and to one of a fixed resistance 18 of high ohmic value, for example, ten megohms. The other end of resistor 18 is connected to a terminal 19 which, in turn, is connected to a fixed contact of set 17*a***.

The terminal 19 also forms a part of a switch 20 which is adjustable to select any one of a plurality of filter elements **21*a* to 21*f* forming a part of a high pass filter 21, each element, with the exception of element 21*f*, including a resistance and condenser connected in series, the filter further including a grounded inductance 21*g* connected to the common terminal of the filter elements 21*a* to 21*e*. This common terminal is further connected by fixed resistances 22 and 23 to the control grid of a triode 24. The filter element 21*f* consists of a condenser connecting one terminal of switch 20 with the junction between fixed resistances 22 and 23. This filter functions to eliminate signals having a frequency lower than a predetermined value, and this cutoff frequency can be selected as desired by manipulation of the switch 20**.

The cathode of the tube 24 is connected to ground through a bias resistor 25 and the anode of this tube is connected to a switch 26, a filter 27, a fixed resistor 28 and a fixed resistor 29 to the control grid of a triode 30. These parts correspond, respectively, to the switch 20, filter 21 and fixed resistances 22, 23 previously described, both in structure and function so that two series-connected high pass filters are provided in the amplifier unit.

The cathode of tube 30 is connected to ground by a bias resistor 31 having a bypass condenser 32 connected in parallel therewith.

The anode of the tube 30 is connected through a coupling condenser 33 to a low pass filter 34 including a grounded resistance **34*a*, a series inductance 34*b***, and a plurality of series-connected resistances 34c to 34g, the junctions between adjacent resistances being connected to condensers 34h to 34k, each condenser, in turn, being connected to a fixed contact point of a switch 35, the movable contact point of which is grounded. The filter 34 functions to cut out all frequencies of greater than a predetermined value, and this cutoff frequency can be selected, as desired, by manipulation of the switch 35.

The resistance 34g is connected to the control grid of a triode 36, the cathode of which is connected to ground through a bias resistor 37 having a bypass condenser 38 connected in parallel therewith.

The anode of the tube 36 is coupled by a condenser 39 and a resistor 40 to the control grid of a triode 41, a grounded load resistance 42 being connected to the junction between the condenser 39 and resistor 40. The cathode of tube 41 is connected to ground through a bias resistor 43 having a filter condenser 44 connected in parallel therewith.

The anode of tube 41 is connected by a coupling condenser 45 to a terminal 46 which, in turn, is connected to ground through the primary winding of an output transformer 47, the secondary winding of which is connected to output terminals 48 and 49 through a potentiometer 50 and a fixed resistance 51.

The terminal 46 is further connected by a fixed resistance 52 to the control grid of tube 41.

It will be evident that the circuit, as thus far described, amplifies the seismic signals fed to the input terminals 10, 11 and impresses the output voltage upon the terminals 48, 49 at a level determined by the settings of potentiometers 14 and 50. Further, the filters 21, 27 and 34 eliminate signals of greater than a first predetermined frequency and less than a second predetermined frequency from the output of the unit, a very flexible combination of cutoff frequencies being obtainable through proper manipulation of the switches 20, 26 and 35.

An automatic gain control signal is withdrawn at terminal 46 and passed through fixed resistances 53 and 54 to the input tube 55 of an automatic gain control system. A multi-position switch 55a having its movable contact point connected to the junction between resistances 53 and 54 permits this junction to be connected to ground directly or through fixed resistances 56, 57. Alternatively, switch 55a can remain "floating" when the contact point is in its upper position.

In accordance with the invention, and as will be explained in detail hereafter, an auxiliary control voltage appearing between a terminal 58 and ground is applied to the grid of tube 55 through a coupling condenser 59, the level of the auxiliary voltage being regulated by a potentiometer 60.

The cathode of the tube 55 is connected to ground through a bias resistor 61 having a bypass condenser 62 connected in parallel therewith, and the anode of this tube is connected through a coupling condenser 63 to the primary winding of a transformer 64 having a condenser 65 connected in parallel therewith.

The secondary winding of transformer 64 has its end terminals connected through rectifiers 66 and 67 to a lead 68 while a center-tap on the secondary winding is connected through a filter including a series resistance 69 and condensers 70, 71 to a lead 72. Connected between the leads 68, 72 are a pair of series resistances 73, 74 and series condensers 75, 76, the junction between both sets of units being grounded.

Lead 72 is further connected through a battery 77 to the cathodes of diodes 78, 79 while lead 68 is connected through a battery 80 of opposite polarity with respect to battery 77, to the anodes of diodes 81 and 82. The anode of diode 78 and the cathode of diode 81 are connected by a lead 83 to the control grid of tube 24 while the anode of diode 79 and the cathode of diode 82 are connected by a lead 84 to the control grid of tube 30.

It will be evident that the automatic volume control voltage impressed upon the control grid of tube 55 is rectified, filtered and applied to the sets 78, 81 and 79, 82 of diodes in such fashion as to vary the impedance thereof, and therefore the grid impedance of the tubes 24 and 30. Accordingly, the gain of the amplifier is varied in accordance with the magnitude of the automatic volume control voltages applied to the control grid of tube 55.

With the relay 17 deenergized, as shown, the filters 21, 27 and 34 are connected in the circuit, and the resistor 18 is short-circuited.

Relay 17 can be energized, as hereafter explained, to move the contact arm of set 17a to its lower position, thus interposing the high resistance 18 in the filter circuit, and connecting the plate of tube 15 through a condenser 85, a potentiometer 86 and a contact set 17b of relay 17 to the control grid of tube 36. Accordingly, when relay 17 is energized, the filter circuits are cut out in their entirety and the output of tube 15 is transferred directly to the control grid of tube 36 at a level determined by the setting of potentiometer 86.

It will be noted that a positive potential is supplied to the anodes of the tubes previously described from a power supply terminal 87 through a filter network including filter resistances 87a to 87h and filter condensers 87i to 87m.

Figure 2:
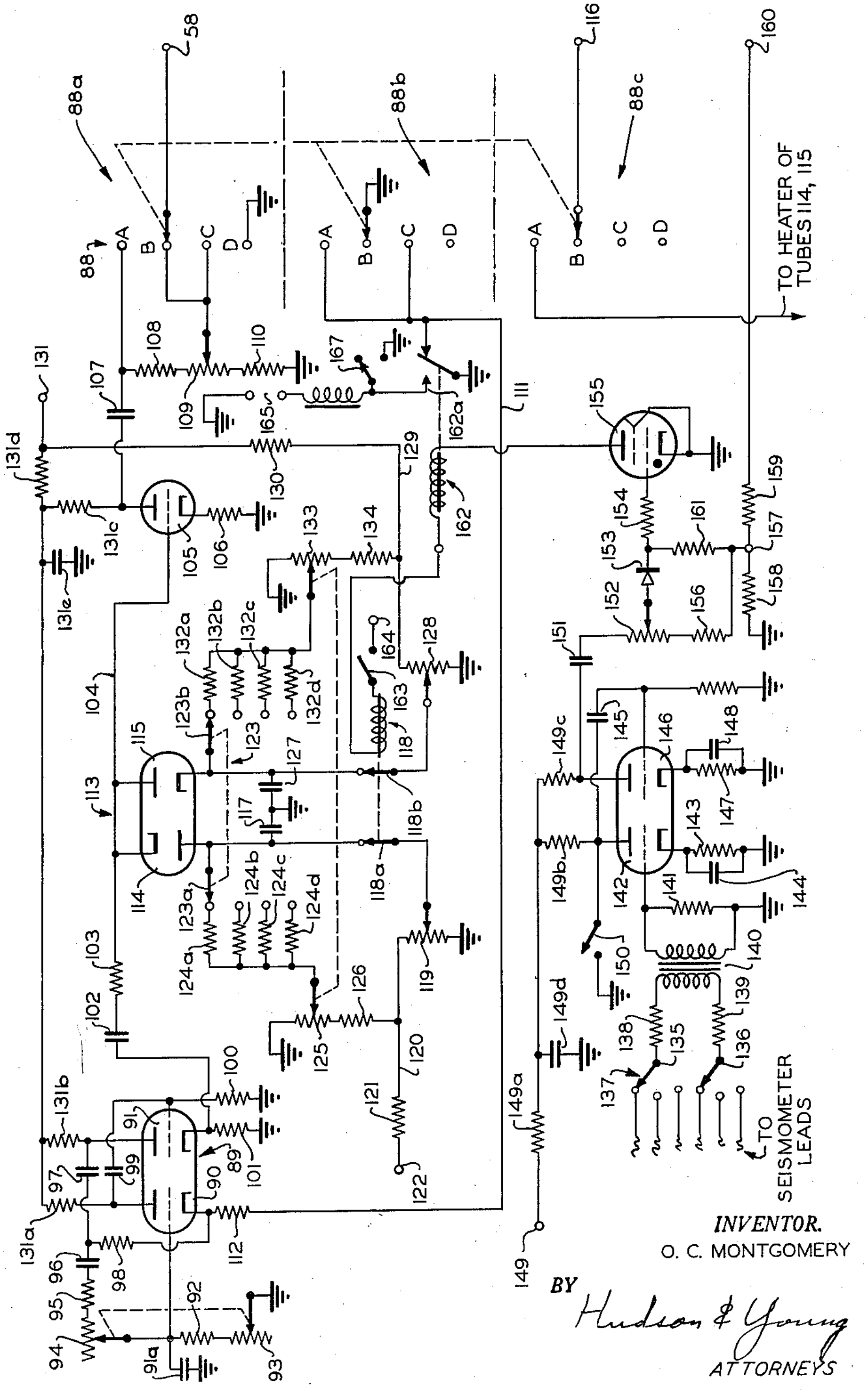
Figure 2 is a schematic circuit diagram of the oscillator circuit, tripping circuit, and control circuit of the automatic gain control system.

Referring now to Figure 2, I have shown a circuit for producing an oscillatory control voltage which is supplied to the terminal 58 to control the gain characteristics of the amplifier of Figure 1. Considerable flexibility in operation is provided by a multipoint switch 88 which is movable to various positions to change the nature and duration of the auxiliary control voltage applied to the automatic gain control system.

The circuit of Figure 2 includes an oscillator of the Wien bridge type which is indicated generally by reference numeral 89. This unit includes a triode 90 having its control grid connected to ground through a condenser 91a and a parallel resistance circuit including a fixed resistance 92 and a variable resistance 93. This control grid is further connected to the control grid of a triode 91 through a variable resistance 94, which is ganged with variable resistance 93, a fixed resistance 95, a condenser 96 and a condenser 97, the junction between condensers 96, 97 being connected through a fixed resistance 98 to the cathode of tube 90.

The anode of tube 90 is connected by a coupling condenser 99 to the control grid of tube 91 which has a grounded load resistor 100. The cathode of tube 91 is connected to ground through a bias resistor 101 and through a coupling condenser 102 and a fixed resistance 103 to a lead 104 which extends to the control grid of a tube 105. The cathode of tube 105 is connected to ground through a bias resistor 106 and its anode is connected through a coupling condenser 107 to a fixed contact point A of a gang 88a of a switch 88. This contact point is also connected to ground through a voltage divider unit consisting of a fixed resistance 108, a potentiometer 109 and a fixed resistance 110, the contactor of the potentiometer 109 being connected to fixed contact points B and C of gang 88a, fixed contact point D of this gang being grounded.

When, responsive to the closure of switch gang 88b, the oscillator tube 89 operates by virtue of a voltage fed back from the plate of tube 91 through the network 94—98 to the grid of tube 90, it will be evident that the output voltage of the oscillator appears between lead 104 and ground, this output being fed through tube 105 to contact point A of gang 88 and, at a lower level, as determined by the potentiometer 109, to the contact points B and C of gang 88a. The frequency of the oscillator can be varied by adjustment of units 93, 94. The frequency of the oscillator can be sufficiently high, compared to the signal frequency, as to greatly minimize problems resulting from interstage coupling and feedback.

The operation of the oscillator is controlled by a gang 88b of switch 88, the movable contact point of which is grounded. There is no connection to fixed contact points B and D of this gang, and fixed contact points A and C thereof are connected by a lead 111 and a fixed resistance 112 to the cathode of tube 90. Thus, when switch 88 is in position A or C, the cathode of tube 90 is grounded and the oscillator unit operates but no oscillation occurs when the cathode of this tube is ungrounded.

The circuit of Figure 2 further includes a diode variable impedance unit generally designated by reference numeral 113. This unit includes two diodes 114 and 115, the heaters of which are controlled by a gang 88*c* of switch 88, fixed contact point A of this gang being connected to the tube heaters, fixed contact points B, C and D being disconnected, and the movable contact point being connected to a heater voltage supply terminal 116. Thus, with switch 88 in position A, the heaters of diodes 114, 115 are energized while no heater current is supplied with switch 88 in position B, C or D.

The cathode of tube 114 and the anode of tube 115 are both connected to lead 104. The anode of tube 114 is connected to ground through a condenser 117, and through a contact set 118*a* of a relay 118 to the contactor of a potentiometer 119 having one fixed terminal grounded and its other fixed terminal connected by a lead 120 and a fixed resistance 121 to a low voltage positive power supply terminal 122. The anode of tube 114 is further connected through a gang 123*a* of a switch 123 to one of a plurality of fixed resistances 124*a* to 124*d*, these resistances all having a common terminal which is connected to the contactor of a potentiometer 125, this potentiometer being connected in series with a fixed resistance 126 between ground and lead 120.

The cathode of tube 115 is connected to ground through a condenser 127, and through a contact set 118*b* of relay 118 to the contactor of a potentiometer 128 having one fixed terminal grounded and its other fixed terminal connected by a lead 129 and a fixed resistance 130 to a high voltage positive power supply terminal 131. The cathode of tube 115 is further connected through a gang 123*b* of switch 123 to one of a set 132*a* to 132*d* of fixed resistances. The fixed resistances 132 have a common terminal connected to the contactor of a potentiometer 133 which is ganged with potentiometer 125. The potentiometers 133 is connected in series with a fixed resistance 134 between the lead 129 and ground.

A positive voltage is supplied to the tubes 90, 91 and 105 from the terminal 131 through a filter network including fixed resistances 131*a* to 131*d* and a condenser 131*e*.

With the contact sets 118*a*, 118*b* closed, as shown, the diodes 114, 115 constitute a high impedance path between the lead 104 and ground, the impedance value being determined by the settings of potentiometer 119 and 128. Under these circumstances, the oscillator signal from unit 89 passes to the circuit of switch 88 with little attenuation. Further, with the contact sets 118*a*, 118*b* closed, the condensers 117, 127 are charged. When relay 118 is energized in the manner hereinafter explained, the charging voltage is removed from the condensers 117, 127 and these condensers discharge, respectively, through resistance units 124, 125 and 132, 133. The resulting voltages at the anode of tube 114 and the cathode of tube 115 cause the impedance of the diode circuits to decrease in an exponential manner at a rate determined by the setting of switch 123 and potentiometers 125, 133. As the diode impedance decreases, the oscillator signal fed from unit 89 to switch gang 88*a* is attenuated and becomes weaker in a progressive manner. When relay contacts 118*a*, 118*b* are closed the described cycle of operation recurs.

The operation of relay 118 is controlled by an amplifier unit which includes a set 135, 136 of input terminals which are selectively connected to one of three sets of seismometer leads by a switch 137. The terminals 135, 136 are connected through fixed resistances 138, 139 respectively, to the primary winding of a transformer 140, the secondary winding of which has a fixed resistance 141 connected in parallel therewith. One secondary terminal is grounded and the other secondary terminal is connected to the control grid of an amplifier tube 142, the cathode of which is connected to ground by a bias resistor 143 having a bypass condenser 144 in parallel therewith. The anode of tube 142 is connected through a coupling condenser 145 to the control grid of a tube 146, the cathode of which is connected to ground by a bias resistor 147 having a condenser 148 connected in parallel therewith. A positive voltage is applied to the anodes of tubes 142, 146 from a power supply terminal 149 through a network including fixed resistances 149*a*, 149*b*, 149*c* and a grounded bypass condenser 149*d*. The anode of tube 142 can be grounded by a switch 150.

The anode of tube 146 is connected through a coupling condenser 151, a potentiometer 152, rectifier 153 and a fixed resistance 154 to the control grid of a gas tube 155. One fixed terminal of potentiometer 152 is connected through a fixed resistance 156 to a terminal 157 at an intermediate point of a voltage divider defined by a grounded fixed resistance 158 and a fixed resistance 159 connected to a negative bias terminal 160. The junction between fixed resistance 154 and rectifier 153 is connected by a fixed resistance 161 to the terminal 157.

The anode of gas tube 155 is connected through the winding of a relay 162, the winding of the relay 118 and a switch 163 to a positive power supply terminal 164.

It will be apparent that a voltage applied from a seismometer to the input transformer 140 will be amplified by tubes 142, 146 and applied to the grid of gas tube 155. If this signal has sufficient magnitude to cause anode current to flow in the gas tube, relays 118 and 162 are energized, and remain energized until the anode circuit is broken by opening switch 163. Moreover, the relays can be operated at any desired time by a momentary closure of switch 150 which sends a pulse of current to the gas tube 155 when switch 163 is closed.

The relay 162 has a contact set 162*a* including a grounded movable contact, a fixed contact connected to lead 111 and the terminals A, C of switch gang 88*b*, and another fixed contact connected in circuit with the winding of relay 17, a current source 165 and ground. The latter fixed contact is also connectable to ground by a manually operated switch 167.

In the over-all operation of the system, as thus far described, it will be noted that, with switch 88 in position A, oscillator 89 operates due to the grounding of lead 111 at contact A of gang 88*b*, the heaters of diodes 114, 115 are energized by operation of switch gang 88*c*, and the output of tube 105 is fed directly to contact 58, Figures 1 and 2, where it provides an auxiliary automatic gain control voltage. Relays 118 and 162 are in the position shown by Figure 2, and it is assumed that switch 167 is in its upper position. Relay 17 is deenergized with the result that the circuit through the lower contact of set 17*a*, Figure 1, and contact set 17*b* is closed so that the filter circuits 21, 27 and 34 are bypassed.

As a result, oscillator 89 applies an alternating voltage to the terminal 58 which, through the action of the automatic gain control circuit of Figure 1, reduces the amplifier gain to a low level. Thus, the initial high amplitude signals do not pass through the amplifier while its gain is at a high level. Initially, the magnitude of the oscillating voltage applied to the control grid of tube 55 is such that this tube is blocked.

At this time, an explosive charge is detonated, and signals of high amplitude reach the amplifier system. These signals are passed through amplifier of Figure 1 at a low level and are recorded but produce no effect upon the automatic gain control system due to the aforementioned blocking of the first automatic gain control tube 55. These fixed high level signals also traverse the amplifier tubes 142, 146 of Figure 2 and cause gas tube 155 to become conductive, thus energizing relay 162 and relay 118. The energization of relay 162 applies ground to the operating winding of relay 17 and causes this relay to close, thus closing the upper contacts of set 17*a*. As a result, the filter units 21, 27 and 34 become effective in the amplifier circuit, and the bypass circuit through contact 17*b* is broken.

The energization of relay 118 breaks the charging circuit for condensers 117, 127 and permits these condensers to discharge through their associated resistance networks, thus exponentially lowering the impedance of the diodes 114 and 115. This causes the oscillatory voltage applied to terminal 58 to decrease with a consequent gradual increase in the gain of the amplifier. It will be noted that this decreasing oscillatory voltage cooperates with the output voltage fed to the control grid of tube 55 from terminal 46 to produce an efficient volume control action wherein the output signal is superimposed upon the exponentially decreasing oscillatory voltage. This continues to the end of the recording period when the relay circuit is reset by momentarily opening switch 163.

With switch 167 in its lower position, the operation is the same as already described except that the filter circuits 21, 27 and 34 of Figure 1 are continuously included due to the energization of relay 17 as a result of the grounding of the relay winding.

With switch 88 in position B, the heater circuits of tubes 114, 115 are interrupted at switch gang 88*c* so that the described exponential lowering of the impedance of the diodes 114, 115 does not occur. In this embodiment, the oscillator circuit is operative by virtue of the ground applied to lead 111 at the contact set 162*a*, and the filter circuits are or are not included depending upon the position of switch 167.

This initially reduces the gain of the amplifier of Figure 1, and blocks tube 55 in the manner already described. In this embodiment, when tube 155 becomes conductive, the oscillator circuit is opened at contact set 162*a* and the operation of the oscillator is terminated. Such actuation of relay 162 also energizes relay 17 and causes filter circuits 21, 27 and 34 to become effective if switch 167 is in its upper position. When the oscillator voltage stops, as described, the automatic gain control circuit operates in the usual manner, as tube 55 is unblocked, and a signal is applied to the automatic gain control system from terminal 46 through fixed resistances 53 and 54. Thus, in this embodiment, the oscillator operates during the initial part only of the recording period, and serves to provide reduced gain during the initial high amplitude period when the first waves are being received, and prevents these high amplitude waves from affecting the operation of the automatic gain control circuit. After this initial period, the oscillator stops, and the automatic gain control circuit functions in the usual manner.

With switch 88 in position C, the oscillator voltage is continuously applied at a fixed amplitude level to terminal 58 and the automatic gain control system, the level being determined by the setting of potentiometer 109. Thus, relay 162 has no effect on the operation of the oscillator 89 as the oscillator circuit is completed through contact C of switch gang 88*b*. Accordingly, with switch 55*a*, Figure 1, in its lower position, a fixed amplifier gain is obtained throughout the recording period, while with switch 55*a* in an upper position, the fixed oscillating voltage cooperates with the signal voltage to obtain a modified automatic gain control action.

With switch 88 in position D, terminal 58 is grounded, and the circuits of Figure 2 have no effect upon the operation of the amplifier which, accordingly, operates as an ordinary amplifier with automatic gain control.

Figure 3:
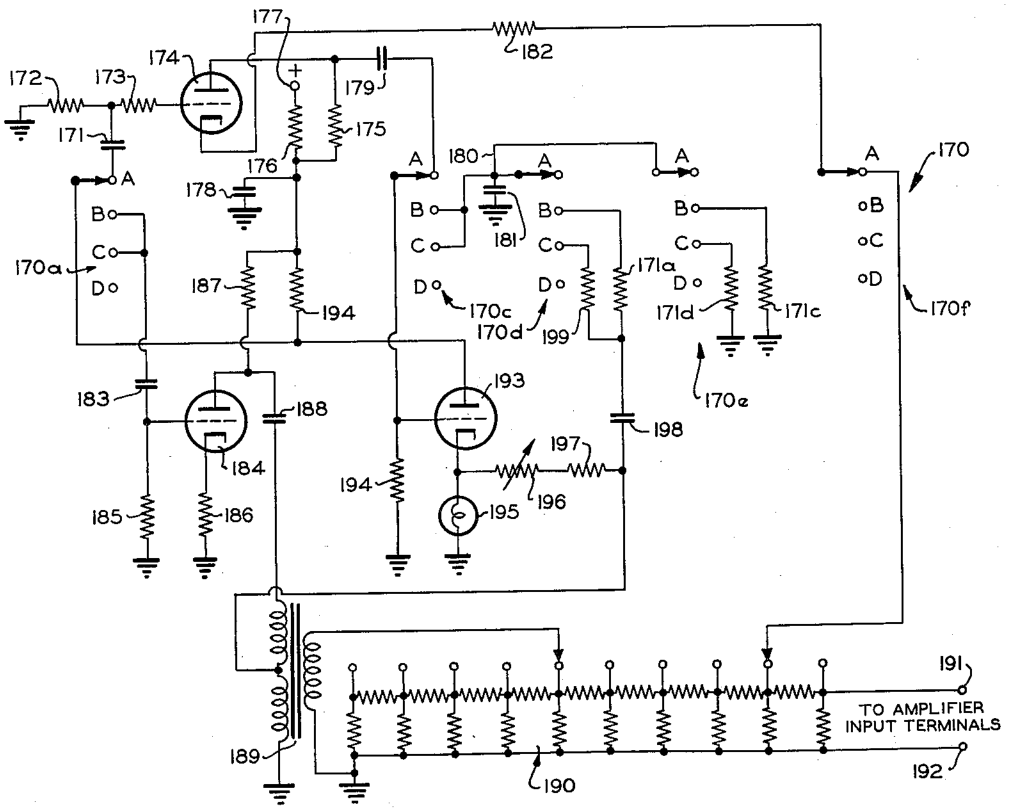
Figure 3 is a schematic circuit diagram of a wave generator.

Referring now to Figure 3, I have shown an oscillator unit which is constructed to deliver either a sine wave or rectangular wave voltage to the amplifier input for test purposes, the sine wave voltage being of variable frequency. This unit includes a five gang multi-position switch 170. A switch gang 170*a* has terminal A thereof connected through a condenser 171 to the junction between two fixed resistances 172 and 173, resistance 172 being grounded and resistance 173 being connected to the control grid of a tube 174. The anode of tube 174 is connected through a fixed resistance 175 and a fixed resistance 176 to a positive power supply terminal 177, and through a condenser 178 to ground. The anode of tube 174 is further connected through a coupling condenser 179 to a fixed contact point A of a switch gang 170*c*. Fixed contact points B and C of gang 170*c* are connected by a lead 180 which has a grounded bypass condenser 181 connected thereto to the movable contact point of a switch gang 170*d*. Lead 180 is further connected to the movable contact point of a switch by gang 170*e* having grounded fixed resistances 171*c*, 171*d* connected to the respective fixed contact points B and C thereof. The cathode of tube 174 is connected by a fixed resistance 182 to a movable contact point of a switch gang 170*f*.

Fixed contact points B and C of switch gang 170*a* are connected through a condenser 183 to the control grid of a tube 184 which has a grounded grid resistance 185. The cathode of tube 184 is connected to ground through a bias resistor 186 and the anode of tube 184 is connected through a fixed resistance 187 to the junction between resistances 175 and 176. The anode of tube 184 is further connected through a coupling condenser 188 to one terminal of a center-tapped primary winding of a transformer 189, the other terminal of which is grounded. The secondary winding of transformer 189 is connected through a T-pad 190 to a set 191, 192 of output terminals which are connectable to the amplifier input terminals 10 and 11 of the amplifier of Figure 1.

The movable contact point of switch gang 170*c* is connected to the control grid of a tube 193 which has a grounded grid resistance 194. The anode of tube 193 is connected to the movable contact point of switch gang 170*a* and through a fixed resistance 194 and fixed resistance 176 to positive power supply terminal 177. The cathode of tube 193 is connected to ground through a resistance or lamp 195, and through a variable resistance 196 and a fixed resistance 197 to the center-tap of the primary winding of transformer 189. This center-tap is further connected through a condenser 198 and fixed resistances 171*a*, 199 to the fixed contact points B and C of switch gang 170*d*.

In operation, with the switch 170 in position A, the circuit functions as a multi-vibrator and produces a rectangular wave output. In this connection, it will be noted that, with switch 170 in position A, the anode of tube 193 is connected to the control grid of tube 174 through condenser 171 and resistance 173 while the anode of tube 174 is connected to the control grid of tube 193 by condenser 179. The control grid circuit of tube 184 is broken at switch gang 170*a*. Thus, a multi-vibrator circuit is provided, and the output is withdrawn from the cathode of tube 174 through switch gang 170*f*, T-pad 190 and ground.

With switch 170 in position B or C, the circuit functions as a sine wave oscillator. With this connection, it will be noted that the cathode circuit of tube 174 is interrupted at switch gang 170*f*, and tube 184 is connected as an amplifier fed by tube 193. Oscillation is maintained by feeding a portion of the output of tube 184 through the primary winding of transformer 189, and resistances 196, 197 to the cathode of tube 193, the output of tube 184 also being impressed through the transformer 189 upon the T-pad 190 and output terminals 191 and 192. Movement of the switch between positions B and C varies the time constant of the resistancecapacitance unit in the grid circuit of tube 193 and thus varies the frequency of oscillation.

With switch 170 in position D, the unit is turned off since each of the contacts D has no connection thereto.

Thus, I have provided an oscillator circuit particularly suitable for supplying either sine wave or rectangular wave test signals to the input of the amplifier, the tube 193 being used both in the rectangular wave hookup and sine wave oscillator hookup.

Figure 4:
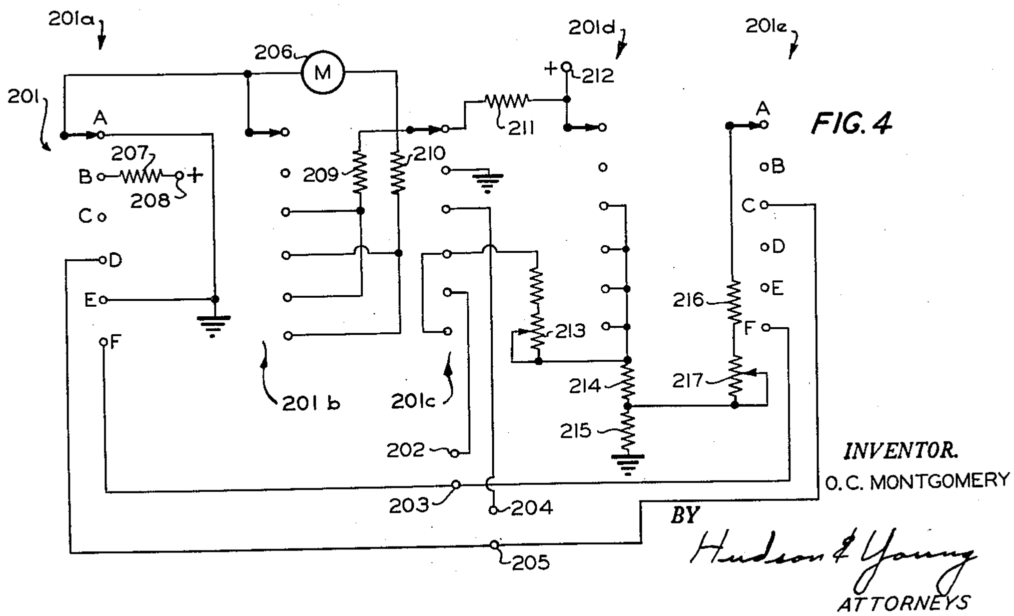
Figure 4 is a schematic circuit diagram of the indicating system.

In Figure 4, I have shown a novel indicating circuit which is adapted to test the maintenance of proper voltages at the low and high voltages of the amplifier as well as to check the continuity and leakage to ground of the seismometer circuits. This circuit includes a multiposition switch 201 having switch gangs 201*a* to 201*e*. The unit is provided with a set of contacts 202, 203 which are connected to one set of seismometer leads and a set of contacts 204, 205 which are connected to another set of seismometer leads.

A meter 206 has one terminal thereof connected to the movable contact point of switch gang 201*a*, contacts A, C and E of this gang being grounded, contact B being connected through a resistance 207 to a power supply terminal 208, contact D being connected to terminal 205 and contact F being connected to contact 203. Switch gang 201*b* inserts a shunt resistance 209 in circuit with the meter in switch positions C and E, and inserts a shunt resistance 210 in circuit with the meter in positions D and F. The other meter terminal is connected to the movable contact point of switch gang 201*c*, contact A being connected through a resistance 211 to a power supply terminal 212, contact B being grounded, contact C being connected to terminal 204, contact E being connected to terminal 202 and contacts D and F being connected through a variable resistance 213, a fixed resistance 214 and a fixed resistance 215 to ground. The movable contact point of gang 201*d* is connected to terminal 212 while contacts C, D, E and F of this gang are connected to the junction between resistances 213 and 214. The movable contact point of gang 201*e* is connected through a fixed resistance 216 and a variable resistance 217 to the junction between resistances 214 and 215. Contact C of this gang is connected to terminal 205 and contact F is connected to terminal 203.

In operation, with the switch at position A, the meter is connected in series with resistance 211, power supply terminal 212, and ground so that the voltage at this terminal is measured. With the switch in position B, the meter is connected in circuit with resistance 207, terminal 208 and ground so that the voltage at terminal 208 is measured. With the switch in position C, the continuity between contacts 204, 205 is checked by a circuit which includes contact 204, contact C of gang 201*c*, the meter, contact C of gang 201*a*, ground, power supply terminal 212, contact C of gang 201*d*, resistances 214, 217 and 216, contact C of gang 201*e* and terminal 205. With the switch in position F, the continuity between contacts 202, 203 is checked by a similar circuit. With the switch in position D, the leakage to ground of the circuit of terminals 204, 205 is checked by a circuit which includes terminal 205, contact D of gang 201, the meter, contact D of gang 201*c*, and resistances 213, 214, 215 to ground. With the switch in any of the last four positions, switch gang 201*b* places the proper resistance 209 or 210 in shunt with the meter.

Thus, I have disclosed a meter circuit which is particularly adaptable for use with the prescribed amplifier system in that the power supply voltages can be checked, and the continuity and leakage resistance to ground of a plurality of seismometer circuits can similarly be checked merely by manipulation of the switch 201.

While the invention has been described in connection with a present, preferred embodiment thereof, it is to be understood that this description is illustrative only and is not intended to limit the invention.

I claim:

1. A seismic amplifying system comprising an amplifier tuned to pass seismic signals; an automatic gain control circuit including signal amplifying means and a first rectifier connected in series, a second rectifier, a source of bias potential connected to said second rectifier, and means connecting said first rectifier to said second rectifier so that signals transmitted through said first rectifier adjust the total bias potential applied to said second rectifier; means connecting said second rectifier directly to the input of said amplifier so that current flow through said second rectifier adjusts the gain of said amplifier; means connecting the output of said amplifier directly to said signal amplifying means so as to adjust the gain of said gain control circuit to vary the gain of said amplifier as an inverse function of the amplitude of the output signal of said amplifier; an oscillator having first and second output terminals; circuit means, independent of said amplifier, connecting said output terminals directly to said signal amplifying means so that said signal amplifying means is blocked when the signal at the output terminals of said oscillator exceeds a preselected value; a variable impedance means connected between said output terminals; means to adjust said variable impedance means; and means responsive to a seismic signal of preselected magnitude to actuate said means to adjust to decrease said impedance means as a function of time so that the signal at the output terminals of said oscillator is decreased.

2. The amplifying system of claim 1 wherein said impedance means and said means to adjust comprises first and second diodes, means connecting said diodes between said output terminals, the polarities of said diodes being opposite one another, first and second capacitors connected to said first and second diodes, respectively, means to charge said capacitors to restrict current flow through said diodes so that a high impedance is connected between said output terminals, and means to discharge said capacitors as a function of time so that conduction of said diodes is increased and the output of said oscillator is decreased.

3. A seismic amplifying system comprising an amplifier tuned to pass seismic signals; an automatic gain control circuit including signal amplifying means, a full wave rectifier connected to the output of said signal amplifying means, a first direct potential source, a second direct potential source, first and second rectifiers connected in series between said first and second potential sources, said potential sources being connected so as to tend to permit current flow through said rectifiers, and means connecting the output of said full wave rectifier across said potential sources and said rectifiers which are connected in series realtionship; means connecting the junction between said first and second rectifiers to the input of said amplifier so that current flow through said first and second rectifiers adjusts the gain of said amplifier; means connecting the output of said amplifier directly to said signal amplifying means so as to adjust the gain of said gain control circuit to vary the gain of said amplifier as an inverse function of the amplitude of the output signal of said amplifier; an oscillator having first and second output terminals; circuit means, independent of said amplifier, connecting said output terminals directly to said signal amplifying means so that said signal amplifying means is blocked when the signal at the output terminals of said oscillator exceeds a preselected value; a variable impedance means connected between said output terminals; means to adjust said variable impedance means; and means responsive to a seismic signal of preselected magnitude to actuate said means to adjust to decrease said impedance means as a function of time so that the signal at the output terminals of said oscillator is decreased.

(References on following page)

References Cited in the file of this patent

UNITED STATES PATENTS

| | | |
|---|---|---|
| 2,286,106 | Ritzmann | June 9, 1942 |
| 2,529,428 | Spielman | Nov. 7, 1950 |
| 2,554,132 | Van Zelst | May 2, 1951 |
| 2,554,905 | Hawkins | June 5, 1951 |
| 2,558,954 | Henson | July 3, 1951 |
| 2,576,892 | Stanton | Nov. 27, 1951 |
| 2,584,680 | Doncyson | Feb. 5, 1952 |
| 2,633,534 | Anderson | Mar. 31, 1953 |
| 2,646,545 | King | July 21, 1953 |
| 2,723,387 | Slavin | Nov. 5, 1955 |
| 2,764,643 | Sulzer | Sept. 25, 1956 |
| 2,794,952 | Golden | June 4, 1957 |
| 2,817,716 | Freedman | Dec. 24, 1957 |
| 2,838,742 | McManis | June 10, 1958 |